United States Patent
Wang et al.

(10) Patent No.: US 9,410,346 B2
(45) Date of Patent: Aug. 9, 2016

(54) VEHICLE DOOR HANDLE AND SENSOR DEVICE THEREOF

(71) Applicants: NATIONAL TAIPEI UNIVERSITY OF TECHNOLOGY, Taipei (TW); HU SHAN AUTO PARTS INC., New Taipei (TW)

(72) Inventors: To-Po Wang, Taipei (TW); Ying-Chih Chen, Taipei (TW); Shih-You Wang, Taipei (TW); Yaon-Ming Yan, Taipei (TW)

(73) Assignees: NATIONAL TAIPEI UNIVERSITY OF TECHNOLOGY, Taipei (TW); HU SHAN AUTO PARTS INC., New Taipei (TW)

( * ) Notice: Subject to any disclaimer, the term of this patent is extended or adjusted under 35 U.S.C. 154(b) by 85 days.

(21) Appl. No.: 14/246,393

(22) Filed: Apr. 7, 2014

(65) Prior Publication Data
US 2015/0028864 A1    Jan. 29, 2015

(30) Foreign Application Priority Data
Jul. 29, 2013    (TW) .............................. 102127105 A

(51) Int. Cl.
*G01R 33/02* (2006.01)
*E05B 81/78* (2014.01)
*H03K 17/955* (2006.01)
*B60R 25/00* (2013.01)

(52) U.S. Cl.
CPC ................. *E05B 81/78* (2013.01); *E05B 81/77* (2013.01); *H03K 17/955* (2013.01); *B60R 25/00* (2013.01)

(58) Field of Classification Search
CPC ........ E05B 81/78; E05B 81/77; H03K 17/955
See application file for complete search history.

(56) References Cited

U.S. PATENT DOCUMENTS

| | | | | |
|---|---|---|---|---|
| 4,602,255 A * | 7/1986 | Kitagawa | ........... | G07C 9/00182 340/12.18 |
| 7,598,915 B2 * | 10/2009 | Ieda | ...................... | B60R 25/246 343/713 |
| 2004/0222804 A1 * | 11/2004 | Inuzuka | .................. | E05B 81/76 324/690 |
| 2004/0257296 A1 * | 12/2004 | Ieda | ....................... | B60R 25/02 343/872 |
| 2005/0285717 A1 * | 12/2005 | Ieda | ...................... | B60Q 1/2669 340/5.72 |
| 2007/0096905 A1 * | 5/2007 | Ieda | ...................... | B60R 25/246 340/562 |
| 2007/0247299 A1 * | 10/2007 | Richards | ................. | E05F 15/00 340/500 |
| 2008/0100522 A1 * | 5/2008 | Inaba | ..................... | B60R 25/246 343/713 |
| 2008/0290668 A1 * | 11/2008 | Ieda | ........................ | B60R 25/24 292/198 |
| 2010/0271049 A1 * | 10/2010 | Van Gastel | .............. | E05B 81/78 324/679 |

* cited by examiner

*Primary Examiner* — Tung X Nguyen
*Assistant Examiner* — Dominic Hawkins
(74) *Attorney, Agent, or Firm* — Hamre, Schumann, Mueller & Larson, P.C.

(57) ABSTRACT

A vehicle door handle includes a case, a first detector and a second detector. The first detector includes a core and a coil that is wound around the core. The second detector is disposed side by side with the first detector, and includes a sensor electrode that has a wavy geometry and that has an axis substantially parallel to the axis of the core. The sensor electrode includes a first wavy segment and a second wavy segment. The first wavy segment corresponds in position to the coil and has a first linear density, and the second wavy segment has a second linear density that is greater than the first linear density.

12 Claims, 6 Drawing Sheets

VEHICLE DOOR HANDLE AND SENSOR DEVICE THEREOF

CROSS-REFERENCE TO RELATED APPLICATION

This application claims priority of Taiwanese application no. 102127105, filed on Jul. 29, 2013.

BACKGROUND OF THE INVENTION

1. Field of the Invention

The present invention relates to a vehicle door handle, and a sensor device for installation in the same.

2. Description of the Related Art

Referring to FIGS. 1 and 2, a vehicle door handle 900 for locking a vehicle door includes a handle cover 911, a handle body 912 and a sensor module 8. The handle cover 911 and the handle body 912 cooperatively define a space 90 therebetween. The sensor module 8 is disposed in the space 90, and includes a wireless detector 81 and a hand detector 82. The wireless detector 81 includes a metallic core 810, and a coil 811 wound around the metallic core 810. The hand detector 82 includes a sensor electrode 821 that cooperates with a sensor module (not shown in the Figures) to detect hand contact by sensing change of electrostatic capacitance. The components and the operation principles of the hand detector 82 can be referred to U.S. Pat. No. 7,598,753 titled "Human body detecting device for vehicles." The metallic core 810 extends in a longitudinal direction of a vehicle, and the coil 811 is wound spirally around the metallic core 810 (see FIG. 3). The sensor electrode 821 is formed as a wiring harness with a long conducting and insulated wire folded back and forth a number of times to form a parallel overlap portion extending in the longitudinal direction of the vehicle. The coil 811 and the sensor electrode 821 are disposed side by side and overlap in the space 90 as shown in FIG. 2. Electromagnetic interference is produced between the wireless detector 81 and the hand detector 82, affecting the detection range of the wireless detector 81. Thus, the detection range of each of the mass manufactured vehicle door handles 900 varies from one to another. Moreover, the electromagnetic interference between the wireless detector 81 and the hand detector 82 may decrease the sensitivity of the hand detector 82. Furthermore, the metallic core 810 of the wireless detector 81 has sharp edges that can cause wear and tear to other components disposed in the space 90, increasing the chance of malfunctioning of those components.

SUMMARY OF THE INVENTION

The object of the present invention is to provide a vehicle door handle that enables electromagnetic interference to be significantly reduced.

According to one aspect of the present invention, there is provided a vehicle door handle including a case, a first detector, and a second detector. The case defines a receiving space. The first detector includes a core that is disposed in the receiving space, and a coil that is wound around the core and that has a first length along an axis of the core. The second detector is disposed side by side with the first detector. The second detector includes a sensor electrode that has a wavy geometry, that has an axis substantially parallel to the axis of the core, and that has a second length along the axis of the sensor electrode. The second length is greater than the first length. The sensor electrode includes a first wavy segment and a second wavy segment. The first wavy segment corresponds in position to the coil and has a first linear density relative to the axis of the sensor electrode, and the second wavy segment has a second linear density relative to the axis of the sensor electrode. The second linear density is greater than the first linear density.

Another object of the present invention is to provide a sensor device for installation in a receiving space of a case of a vehicle door handle.

According to another aspect of the present invention, the sensor device includes a first detector and a second detector. The first detector includes a core that is to be disposed in the receiving space, and a coil that is wound around the core and that has a first length along an axis of the core. The second detector is disposed side by side with the first detector. The second detector includes a sensor electrode that has a wavy geometry, that has an axis substantially parallel to the axis of the core, and that has a second length along the axis of the sensor electrode. The second length is greater than the first length. The sensor electrode includes a first wavy segment and a second wavy segment. The first wavy segment corresponds in position to the coil and has a first linear density relative to the axis of the sensor electrode, and the second wavy segment has a second linear density relative to the axis of the sensor electrode. The second linear density is greater than the first linear density.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
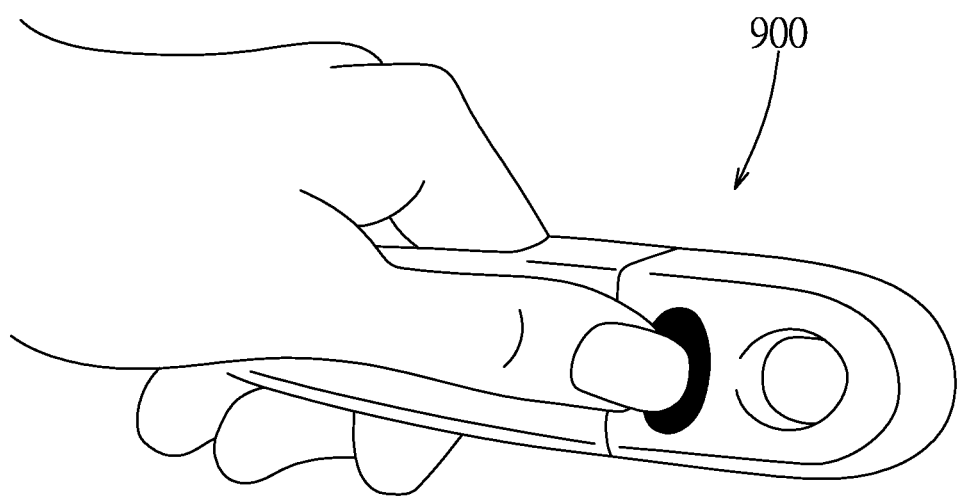
FIG. 1 is a perspective view illustrating a conventional vehicle door handle.
Figure 2:
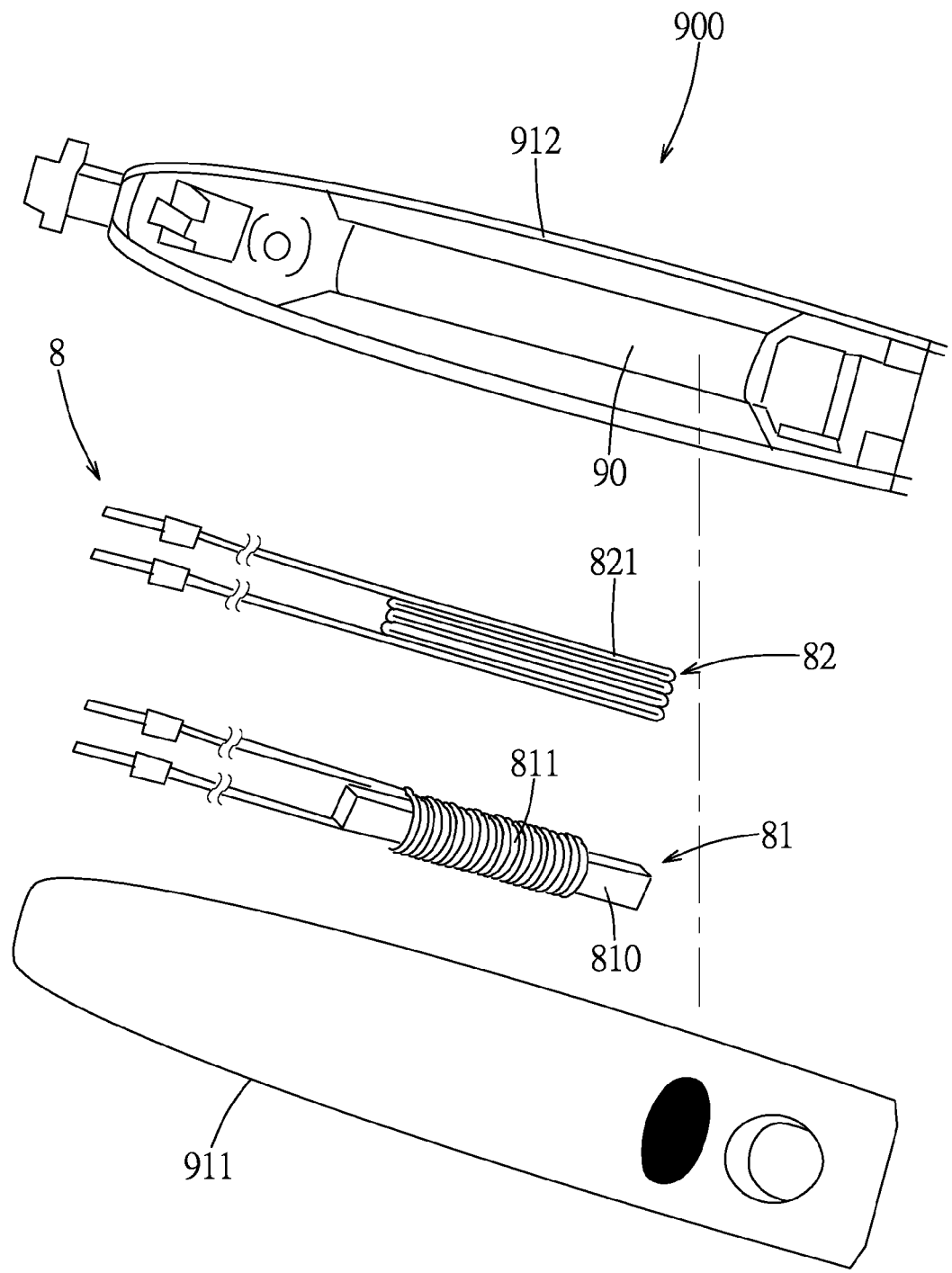
FIG. 2 is an exploded perspective view illustrating components included in the conventional vehicle door handle.
Figure 3:
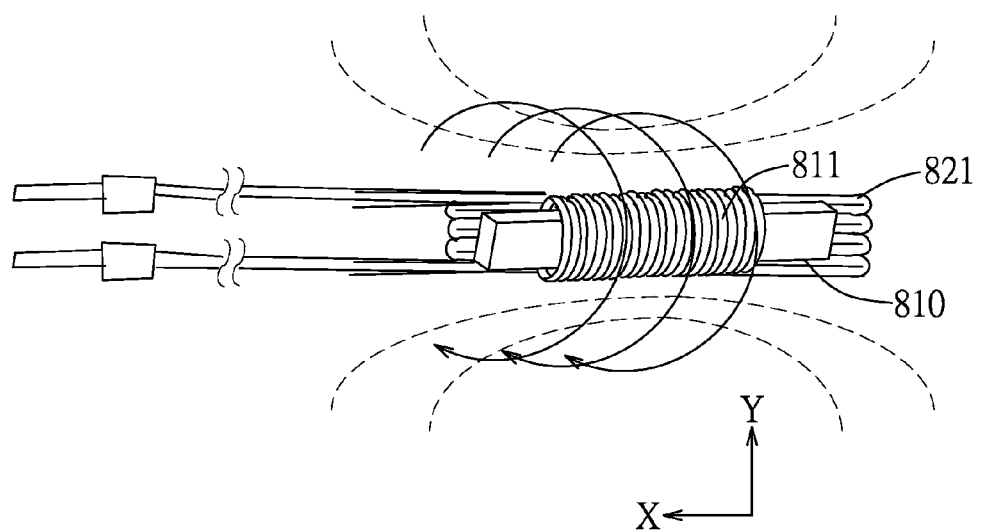
FIG. 3 is a schematic diagram illustrating the electromagnetic interference between the wireless detector and the hand detector of the conventional vehicle door handle.
Figure 4:
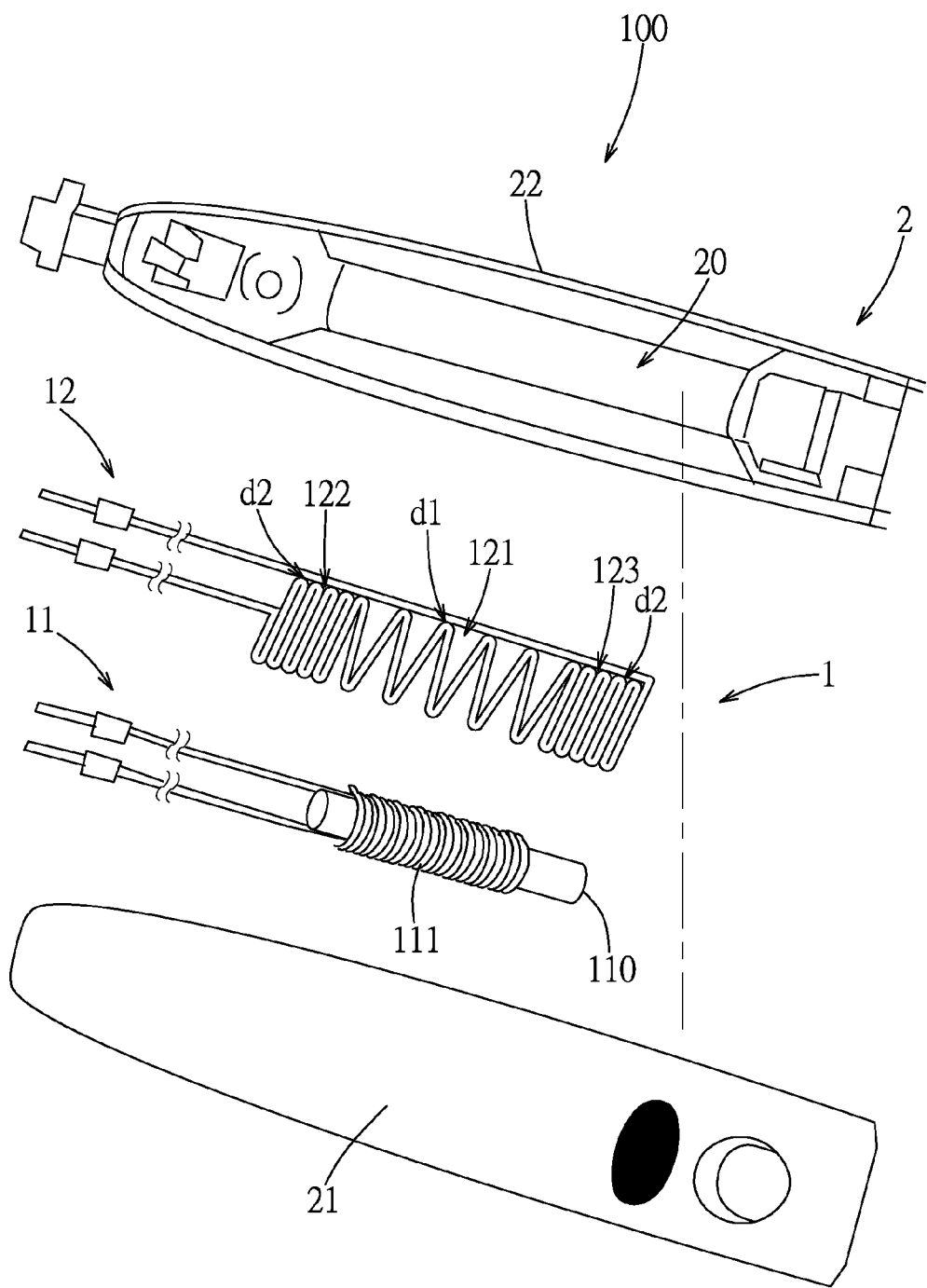
FIG. 4 is an exploded perspective view illustrating a preferred embodiment of a vehicle door handle according to the present invention.
Figure 5:
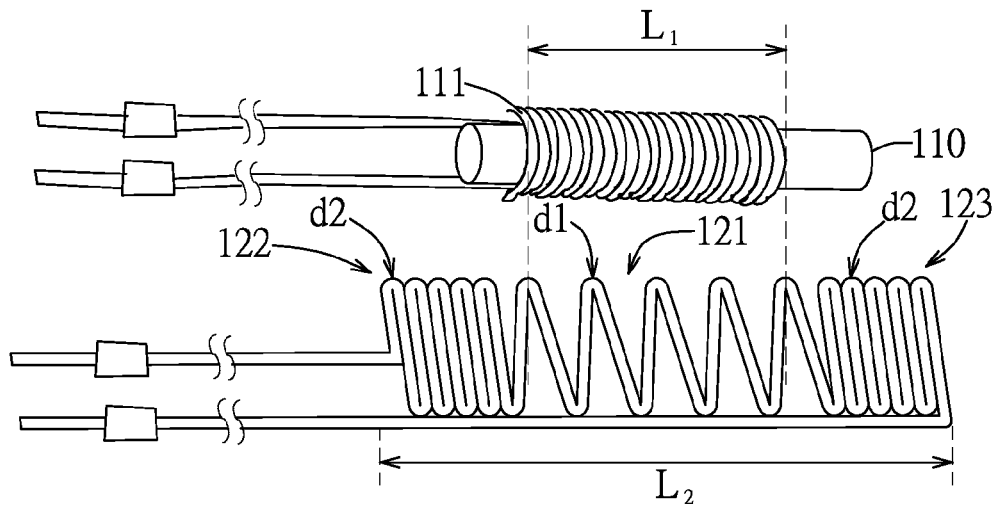
FIG. 5 is an exploded perspective view illustrating a first detector and a second detector of the vehicle door handle in the preferred embodiment of the present invention.

Referring to FIGS. 4 and 5, a sensor device 1 is installed in a vehicle door handle 100 according to a preferred embodiment of the present invention. In other embodiments, the sensor device 1 can be installed in other types of door handles, and is not limited to only the vehicle door handle 100.

The vehicle door handle 100 includes a case 2 that includes a top cover 21 and a base 22. The top cover 21 and the base 22 cooperate to define a receiving space 20 in the case 2. The sensor device 1 that is installed in the vehicle door handle 100 includes a first detector 11 and a second detector 12.

The first detector 11 includes a core 110 that is disposed in the receiving space, and a coil 111 that is wound around the core 110. The core 110 is one of a cast steel core, a silicon steel core, an air core, a non-magnetic core, a soft-magnetic iron core (soft metal core, silicon steel core, nickel metal alloy core), and a hard-magnetic iron core (carbon steel core, tungsten steel core, aluminum tungsten cobalt alloy core). The coil 111 has a first length (L1) along an axis of the core 110 to provide for detection of a wireless signal, such as Radio Frequency Identification (RFID), within an area range.

The second detector 12 is disposed side by side with the first detector 11. The second detector 12 includes a sensor electrode. The sensor electrode has a wavy geometry, has an axis substantially parallel to the axis of the core 110 of the first detector 11, and has a second length (L2) along the axis of the sensor electrode. The second length (L2) is greater than the first length (L1). The sensor electrode includes a first wavy segment 121, a second wavy segment 122 and a third wavy segment 123, with the first wavy segment 121 being disposed between the second wavy segment 122 and the third wavy segment 123. The first wavy segment 121 corresponds in position to the coil 111, and has a first linear density (d1) (linear density refers to the number of wave crest per unit length along the axis of the sensor electrode) relative to the axis of the sensor electrode. The second wavy segment 122 and the third wavy segment 123 have a second linear density (d2) relative to the axis of the sensor electrode, and the second linear density (d2) is greater than the first linear density (d1) for reducing electromagnetic interference between the first detector 11 and the second detector 12.

In other embodiments, the sensor electrode can include only the first wavy segment 121 and one of the second wavy segment 122 and the third wavy segment 123, as long as the first wavy segment 121 corresponding in position to the coil 111 has a first linear density (d1) relative to the axis of the sensor electrode that is lower than the second linear density (d2) of the second wavy segment 122 or the third wavy segment 123.

The inductor formed by the coil 111 wound around the core 110 has a magnetic flux (ψ) passing through the core 110, and the magnetic flux (ψ) can be represented by the following formula:

$$\psi = F/R = \mu * A * i/l,$$

where ψ is the magnetic flux, F is the magnetomotive force, R is the magnetic resistance, μ is the magnetic permeability, A is the core cross-sectional area, i is the current, and l is the magnetic path length.

From the above formula, the magnetic flux (ψ) can be increased by increasing the magnetic permeability (μ) and the core cross-sectional area (A) of the core 110, or reducing the magnetic path length (l) of the core 110. According to the above formula, the material of the core 110 is selected to have a high magnetic permeability (μ) in order to reduce the dimension of the core 110. Furthermore, the core 110 is in the shape of a cylindrical bar to reduce wear and tear by sharp edges, effectively reducing damages to other components surrounding the core 110.

Figure 6:
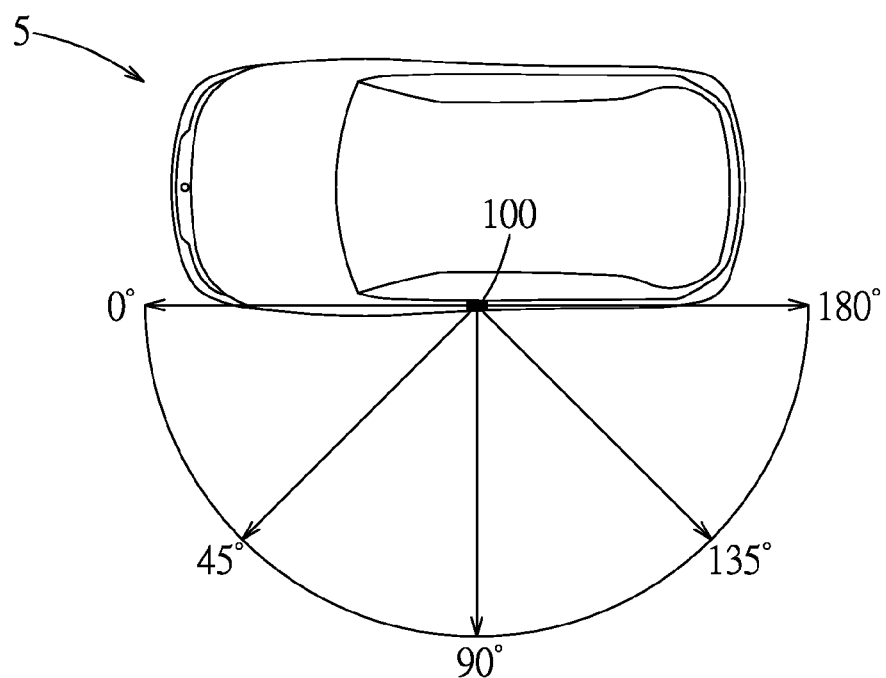
FIG. 6 is a diagram illustrating angles of measurement for the sensor device installed in the vehicle door handle.

The detection distances of a wireless signal in the conventional art and this embodiment are measured and shown in Tables 1 and 2, respectively. Referring to FIG. 6, the detection distances in this embodiment, as compared to those in the conventional art, increase by 20 centimeters to 40 centimeters, and thus the detection ability is significantly improved in this embodiment.

TABLE 1 detection distances of a wireless signal in the conventional art (unit: Centimeters)

|  | 0° | 45° | 90° | 135° | 180° |
| --- | --- | --- | --- | --- | --- |
| first test | 134 | 130 | 127 | 137 | 152 |
| second test | 134 | 138 | 126 | 139 | 155 |
| third test | 134 | 138 | 126 | 138 | 156 |
| average | 134 | 135 | 126 | 138 | 154 |

TABLE 2 detection distances of a wireless signal in the present invention (unit: Centimeters)

|  | 0° | 45° | 90° | 135° | 180° |
| --- | --- | --- | --- | --- | --- |
| first test | 175 | 170 | 152 | 170 | 173 |
| second test | 175 | 170 | 152 | 170 | 175 |
| third test | 175 | 170 | 152 | 170 | 174 |
| average | 175 | 170 | 152 | 170 | 174 |

Figure 7:
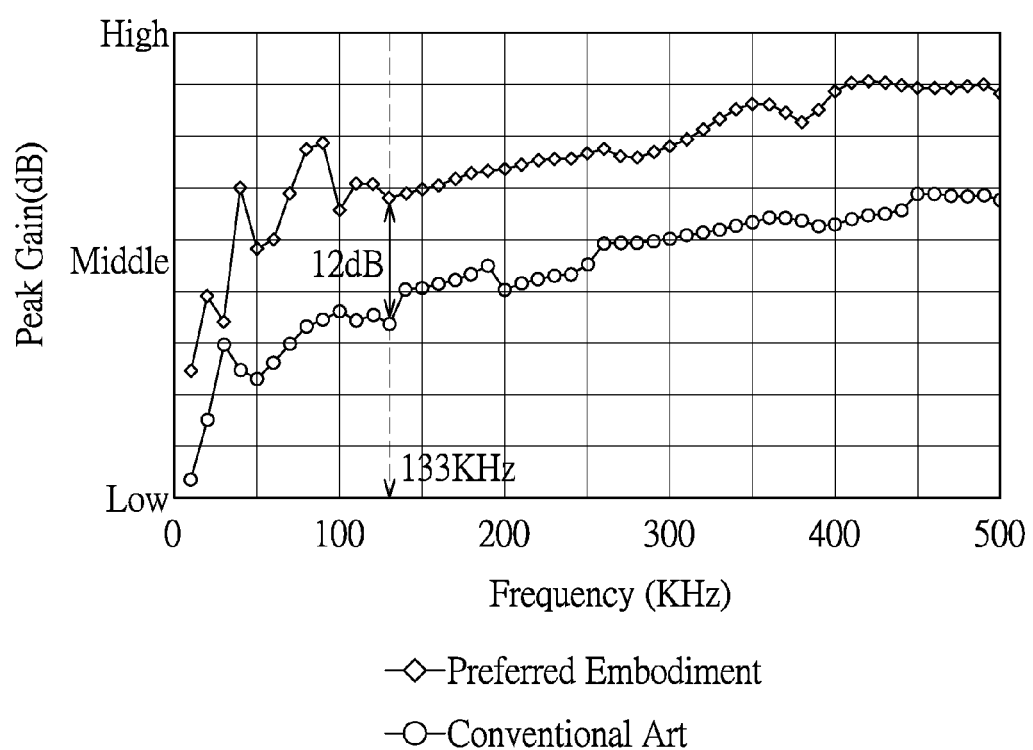
FIG. 7 is a waveform diagram illustrating a comparison between the peak gain of a sensor electrode having a common linear density in the conventional vehicle door handle and the peak gain of the sensor electrode having a varied linear density in the vehicle door handle according to the present invention.

FIG. 7 shows a comparison between the peak gain of the sensor electrode 821 having a uniform linear density in the conventional art and the peak gain of the sensor electrode having a varied linear density in this embodiment. At operating frequency of 133 Khz, the peak gain in this embodiment is higher than the peak gain in the conventional art by 12 dB.

The sensor device 1 and the vehicle door handle 100 have several advantages. The electromagnetic interference between the first detector 11 and the second detector 12 is significantly reduced, increasing both the detection distances of a wireless signal and the sensitivity of the second detector 12. In addition, the core 110 having the shape of a cylindrical bar reduces wear and tear by sharp edges, effectively reducing damages to other components surrounding the core 110.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A vehicle door handle comprising: a case that defines a receiving space; a first detector including a core that is disposed in said receiving space, and a coil that is wound around said core and that has a first length along an axis of said core; and a second detector disposed side by side with said first detector, said second detector including a sensor electrode that has a wavy geometry, that has an axis substantially parallel to said axis of said core, and that has a second length along said axis of said sensor electrode, the second length being greater than the first length, said sensor electrode including a first wavy segment and a second wavy segment, said first wavy segment corresponding in position to said coil and having a first linear density relative to said axis of said sensor electrode, said second wavy segment having a second linear density relative to said axis of said sensor electrode, the second linear density being greater than the first linear density and configured to reduce electromagnetic interference between said first detector and said second detector.

2. The vehicle door handle according to claim 1, wherein said sensor electrode further includes a third wavy segment having the second linear density relative to said axis of said sensor electrode, said first wavy segment being disposed between said second wavy segment and said third wavy segment.

3. The vehicle door handle according to claim 1, wherein said core is made of a material selected according to a magnetic flux relationship that correlates magnetic flux, magnetomotive force, magnetic resistance, magnetic permeability, core cross-sectional area, current and magnetic path length, such that magnetic permeability of said material results in a reduced size of said core.

4. The vehicle door handle according to claim 3, wherein said core is a cylindrical bar.

5. The vehicle door handle according to claim 4, wherein said core is one of a cast steel core, a silicon steel core, an air core, a non-magnetic core, a soft-magnetic iron core, and a hard-magnetic iron core.

6. The vehicle door handle according to claim 3, wherein said sensor electrode further includes a third wavy segment having the second linear density relative to said axis of said sensor electrode, said first wavy segment being disposed between said second wavy segment and said third wavy segment.

7. A sensor device for installation in a receiving space of a case of a vehicle door handle, said sensor device comprising: a first detector including a core that is to be disposed in the receiving space, and a coil that is wound around said core and that has a first length along an axis of said core; and a second detector disposed side by side with said first detector, said second detector including a sensor electrode that has a wavy geometry, that has an axis substantially parallel to said axis of said core, and that has a second length along said axis of said sensor electrode, the second length being greater than the first length, said sensor electrode including a first wavy segment and a second wavy segment, said first wavy segment corresponding in position to said coil and having a first linear density relative to said axis of said sensor electrode, said second wavy segment having a second linear density relative to said is of said sensor electrode, the second linear density being greater than the first linear density and configured to reduce electromagnetic interference between the first detector and the second detector.

8. The sensor device according to claim 7, wherein said sensor electrode further includes a third wavy segment having the second linear density relative to said axis of said sensor electrode, said first wavy segment being disposed between said second wavy segment and said third wavy segment.

9. The sensor device according to claim 7, wherein said core is made of a material selected according to a magnetic flux relationship that correlates magnetic flux, magnetomotive force, magnetic resistance, magnetic permeability, core cross-sectional area, current and magnetic path length, such that magnetic permeability of said material results in a reduced size of said core.

10. The sensor device according to claim 9, wherein said core is a cylindrical bar.

11. The sensor device according to claim 10, wherein said core is one of a cast steel core, a silicon steel core, an air core, a non-magnetic core, a soft-magnetic iron core, and a hard-magnetic iron core.

12. The sensor device according to claim 9, wherein said sensor electrode further includes a third wavy segment having the second linear density relative to said axis of said sensor electrode, said first wavy segment being disposed between said second wavy segment and said third wavy segment.

* * * * *